(12) United States Patent
Boemler

(10) Patent No.: US 7,483,067 B2
(45) Date of Patent: Jan. 27, 2009

(54) COLUMN-PARALLEL SIGMA-DELTA ANALOG-TO-DIGITAL CONVERSION FOR IMAGERS

(75) Inventor: Christian Boemler, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 742 days.

(21) Appl. No.: 11/106,465

(22) Filed: Apr. 15, 2005

(65) Prior Publication Data

US 2006/0232676 A1   Oct. 19, 2006

(51) Int. Cl.
*H04N 3/14* (2006.01)
*H04N 5/335* (2006.01)

(52) U.S. Cl. .............. 348/308; 348/310; 348/294; 341/143; 341/155; 250/208.1

(58) Field of Classification Search .............. None
See application file for complete search history.

(56) References Cited

U.S. PATENT DOCUMENTS

| | | | |
|---|---|---|---|
| 5,565,867 A | 10/1996 | Tiemann | |
| 5,886,659 A | 3/1999 | Pain et al. | |
| 5,964,708 A | 10/1999 | Freeman et al. | |
| 6,081,118 A | 6/2000 | Kaplan | |
| 6,124,819 A | 9/2000 | Zhou et al. | |
| 6,166,367 A | 12/2000 | Cho | |
| 6,665,013 B1 | 12/2003 | Fossum et al. | |
| 6,801,148 B2 | 10/2004 | Freeman et al. | |
| 7,023,369 B2* | 4/2006 | Bocko et al. | ........ 341/143 |
| 7,227,570 B2* | 6/2007 | Sato et al. | ........ 348/222.1 |
| 7,242,332 B1* | 7/2007 | Boemler | ........ 341/118 |

| | | | |
|---|---|---|---|
| 2004/0080629 A1 | 4/2004 | Sato et al. | |
| 2008/0169952 A1* | 7/2008 | Boemler | ........ 341/143 |

FOREIGN PATENT DOCUMENTS

WO   WO 02/51128 A2   6/2002

(Continued)

OTHER PUBLICATIONS

Ian Galton, "Delta-Sigma Data Conversion in Wireless Transceivers," IEEE Transactions on Microwave Theory and Techniques, vol. 50, No. 1, Jan. 2002.

(Continued)

*Primary Examiner*—Ngoc-Yen T Vu
*Assistant Examiner*—Cynthia Calderon
(74) *Attorney, Agent, or Firm*—Dickstein Shapiro LLP

(57) ABSTRACT

A sigma-delta modulation sensing circuit and an analog-to-digital converter for an imager that do not rely on the ratio of the reset and pixel voltage levels being sensed. The sensing circuit includes a regulation branch based on a reference voltage common across multiple columns of the imager. The regulation branch has an adjustable resistance that is modulated during the sensing operation, which creates an adjustment current that is applied during the sensing operation to a current associated with one of the reset and pixel signals. The sensing circuit and analog-to-digital converter can generate a digital code based on the difference between the reset and pixel signal voltage levels, which substantially mitigates noise associated with the pixel and reset signal voltages. The reference voltage can also be used as a gain control for the imager as well.

33 Claims, 5 Drawing Sheets

FOREIGN PATENT DOCUMENTS

WO    WO 02/51128 A3    6/2002

OTHER PUBLICATIONS

Sunetra K. Mendis et al., "CMOS Active Pixel Image Sensors for Highly Integrated Imaging Systems," IEEE Journal of Solid-State Circuits, vol. 32, No. 2, Feb. 1997.

Sunetra K. Mendis et al., "Design of a low-light-level image sensor with on-chip sigma-delta analog-to-digital," Abstract, http://spie.org/scripts/abstract.pl?bibcode=1993SPIE%2e1900%2e%2e%2e31M&P . . . Dec. 29, 2004.

D. Mensa et al., "48-GHz Digital IC's and 85-GHz Baseband Amplifiers Using Transferred-Substrate HBT's," IEEE Journal of Solid-State Circuits, vol. 34, No. 9, Sep. 1999.

Zhimin Zhou, et al., "CMOS Active Pixel Sensor with On-Chip Successive Approximation Analog-To-Digital Converter," IEEE Transactions on Electron Devices, vol. 44, No. 10, Oct. 1997.

R. Gallorini et al., "A Capacitance Meter based on an Oversampling Sigma-Delta Modulator and Its Application to Capacitive Sensor Interface," IEEE, pp. 1537-1540, 2001.

J.H. Shen et al., "A High Image Rejection Continuous-Time IF Sigma-Delta ADC with Time-Sharing of Input Resistors," IEEE, pp. 109-112, 2003.

Martin A. Brooke, "Enhanced Imaging Arrays Using a Sigma Delta ADC in Si CMOS for Each Array Pixel," IEEE, pp. 11-12, 2000.

Jorge Grilo et al., "A 12-mW ADC Delta-Sigma Modulator With 80 dB of Dynamic Range Integrated in a Single-Chip Bluetooth Transceiver," IEEE Journal of Solid-State Circuits, vol. 37, No. 3, Mar. 2002.

* cited by examiner

COLUMN-PARALLEL SIGMA-DELTA ANALOG-TO-DIGITAL CONVERSION FOR IMAGERS

FIELD OF THE INVENTION

The invention relates generally to imaging devices and more particularly to a sigma-delta analog-to-digital converter used in imaging devices.

BACKGROUND

A CMOS imager circuit includes a focal plane array of pixel cells, each one of the cells including a photosensor, for example, a photogate, photoconductor or a photodiode within a substrate for accumulating photo-generated charge in the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state; (4) transfer of charge to the storage region accompanied by charge amplification; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. Nos. 6,140,630, 6,376,868, 6,310,366, 6,326,652, 6,204,524 and 6,333,205, assigned to Micron Technology, Inc., which are hereby incorporated by reference in their entirety.

A typical four transistor (4T) CMOS imager pixel 10 is shown in FIG. 1. The pixel 10 includes a photosensor 12 (e.g., photodiode, photogate, etc.), transfer transistor 14, floating diffusion region FD, reset transistor 16, source follower transistor 18 and row select transistor 20. The photosensor 12 is connected to the floating diffusion region FD by the transfer transistor 14 when the transfer transistor 14 is activated by a transfer gate control signal TX.

The reset transistor 16 is connected between the floating diffusion region FD and an array pixel supply voltage Vaa_pix. A reset control signal RST is used to activate the reset transistor 16, which resets the floating diffusion region FD to the array pixel supply voltage Vaa_pix level as is known in the art.

The source follower transistor 18 has its gate connected to the floating diffusion region FD and is connected between the array pixel supply voltage Vaa_pix and the row select transistor 20. The source follower transistor 18 converts the charge stored at the floating diffusion region FD into an electrical output voltage signal Vout. The row select transistor 20 is controllable by a row select signal SEL for selectively connecting the source follower transistor 18 and its output voltage signal Vout to a column line 22 of a pixel array.

The signals output from the pixel 10 are analog voltages representing a reset signal Vrst (generated when the floating diffusion region FD is reset) and a pixel output signal Vsig generated after charge from the photosensor 12 is transferred to the floating diffusion region FD. The output signals must be converted from analog to digital for further processing. Due to a typically low capacitance on the floating diffusion region FD, the kT/C noise on Vrst can be excessive. When transferring the charge from photosensor 12 to the floating diffusion region FD, this charge is ideally noiseless and is subtracted from the Vrst signal to produce the Vsig signal. Thus, the pixel output signals Vrst, Vsig are usually sent to a sample and hold circuit and then to a differencing circuit, which forms the signal Vrst-Vsig. This difference signal is then sent to an analog-to-digital converter (ADC) (not shown in FIG. 1).

FIG. 2a illustrates a conventional sigma-delta sensing circuit 50 that could be used as part of a sigma-delta analog-to-digital converter. The sensing circuit 50 comprises a first branch 51 for sensing the reset signal Vrst from a sample and hold capacitor (not shown), and a second branch 61 for sensing the pixel signal Vsig from another sample and hold capacitor (not shown). The sensing circuit 50 also comprises a current mirror 80, a comparator 70 and a NAND gate 72. The comparator 70 may be a regenerative latch type, where the digital output is synchronized to the phase clocks. Smoothing capacitors (not shown) may also be added to the source follower outputs to convert the switching nature of the currents through all branches 51, 61 into near-DC currents for the source follower.

The first branch 51 comprises three PMOS transistors 52, 54, 56 and a capacitor 58. The first PMOS transistor 52 is connected between a supply voltage Vaa and a source/drain terminal of the second PMOS transistor 54. The gate of the first PMOS transistor 52 is connected to a first clock signal /PHI1. The second PMOS transistor 54 has a second source/drain terminal connected to a source/drain terminal of the third PMOS transistor 56. The gate of the second PMOS transistor 54 is connected to a second clock signal /PHI2. The capacitor 58 is connected between a ground potential and the connection between the first and second PMOS transistors 52, 54.

The second source/drain terminal of the third PMOS transistor 56 is connected to a source/drain terminal of a first NMOS transistor 82 of the current mirror 80. The gate of the third PMOS transistor 56 is connected to receive the reset signal Vrst; the third PMOS transistor 56 acts as a source follower transistor for the first branch 51. The second source/drain of the third PMOS transistor 56 is also coupled to a first input of the comparator 70.

In operation, the first clock signal /PHI1 is applied to the gate of the first PMOS transistor 52 and the second clock signal /PHI2 is applied to the gate of the second PMOS transistor 54 in a complementary non-overlapping fashion and at a specified frequency. The designations "/PHI1"and "/PHI2"are used to mean the inverted clock signal of non-overlapping clocks PHI1 and PHI2, respectively. Thus, /PHI1 and /PHI2 cannot be low at the same time. The clock signals /PHI1, /PHI2 are typically generated by a clock generator or control circuit. The two PMOS transistors 52, 54 act as switches under the control of their respective clock signals /PHI1, /PHI2. Activating the first PMOS transistor 52 (i.e., closing the switch by setting /PHI1 low) immediately after deactivating the second PMOS transistor 54 (i.e., opening the switch by setting /PHI2 high) will charge the capacitor 58. Similarly, deactivating the first PMOS transistor 52 (i.e., opening the switch) immediately before activating the second PMOS transistor 54 (i.e., closing the switch) will discharge the capacitor 58.

Using the non-overlapping complementary clock signals /PHI1, /PHI2 to open and close the "switches" (i.e., transistors 52, 54) causes the capacitor 58 to simulate a resistor (e.g., resistor Ri in FIG. 2b). The equivalent resistance of the resistor Ri is equal to 1/f·C, where C is the capacitance of the capacitor 58 and f is the frequency of the clock signals /PHI1, /PHI2. By varying the frequency f, the resistance may be adjusted as desired. For example, the larger the frequency f, the smaller the resistance. The changing of the resistance of the capacitor 58 is referred to as "modulating" the resistance. A reset current $I_R$ based on the resistance of the first branch 51 and the reset voltage Vrst flows through the first branch 51 to the comparator 70.

The second branch 61 comprises three PMOS transistors 62, 64, 66 and a capacitor 68. The fourth PMOS transistor 62 is connected between the supply voltage Vaa and a source/drain terminal of the fifth PMOS transistor 64. The gate of the fourth PMOS transistor 62 is connected to the first clock signal /PHI1. The fifth PMOS transistor 64 has a second source/drain terminal connected to a source/drain terminal of the sixth PMOS transistor 66. The gate of the fifth PMOS transistor 64 is connected the output of the NAND gate 72. The second capacitor 68 is connected between a ground potential and the connection between the fourth and fifth PMOS transistors 62, 64.

The second source/drain terminal of the sixth PMOS transistor 66 is connected to a source/drain terminal of a second NMOS transistor 84 of the current mirror 80. The gate of sixth PMOS transistor 66 is connected to receive the pixel signal Vsig; the sixth PMOS transistor 66 acts as a source follower transistor for the second branch 61. The second source/drain of the sixth PMOS transistor 66 is also coupled to a second input of the comparator 70. The output of the comparator 70 is connected to a first input of the NAND gate 72. The non-inverted second clock signal PHI2 is connected to a second input of the NAND gate 72.

In operation, the first clock signal /PHI1 is applied to the gate of the fourth PMOS transistor 62. The output of the NAND gate 72, which is essentially clocked by the non-inverted second clock signal PHI2, is applied to the gate of the fifth PMOS transistor 64. As set forth above, the clock signals /PHI1, /PHI2 are non-overlapping complementary signals. The two PMOS transistors 62, 64 act as switches, where the fourth PMOS transistor 62 is controlled by the first clock signal /PHI1 and the fifth PMOS transistor 64 is controlled by the output of the NAND gate 72 (as clocked by PHI2). Activating the fourth PMOS transistor 62 (i.e., closing the switch) immediately after deactivating the fifth PMOS transistor 64 (i.e., opening the switch) will charge the capacitor 68. Similarly, deactivating the fourth PMOS transistor 62 (i.e., opening the switch) immediately before activating the fifth PMOS transistor 64 (i.e., closing the switch) will discharge the capacitor 68.

Using the non-overlapping complementary clock signals /PHI1, /PHI2 (and the output of the comparator 70) to open and close the "switches" (i.e., transistors 62, 64) causes the capacitor 68 to simulate a resistor (e.g., resistor Rx in FIG. 2b) with an equivalent resistance equal to 1/f·C, where C is the capacitance of the capacitor 68 and f is the average frequency of the clock signal output from the NAND gate 72. As set forth above, by varying the frequency f, the resistance may be adjusted or modulated as desired. A pixel signal current $I_S$ based on the resistance of the second branch 61 and the Vsig voltage level flows through the second branch 61 to the comparator 70.

The operation of the sensing circuit is now explained in more detail with reference to FIG. 2b. FIG. 2b illustrates a conventional sigma-delta analog-to-digital converter 100 using the FIG. 2a sigma-delta sensing circuit 50. Portions of the sensing circuit 50 illustrated in FIG. 2a have been replaced by their functional equivalents in FIG. 2b. For example, in FIG. 2b, a first resistor Ri replaces the first switched capacitor 58 and the first and second PMOS transistors 52, 54 shown in FIG. 2a. Likewise, in FIG. 2b, a second resistor Rx, shown as an adjustable resistor, replaces the second switched capacitor 68 and the fourth and fifth PMOS transistors 62, 64 shown in FIG. 2a. The NAND gate 72 is also not shown in FIG. 2b. The analog-to-digital converter 100 also includes a counter 90 connected to the output of the comparator 70.

The sensing circuit 50, and as such, the analog-to-digital converter 100, operates based on a sigma-delta modulation approach. In principle, the sensing circuit 50 attempts to get the reset signal current $I_R$ and the pixel signal current $I_S$ to be the same. Since typically it is most likely that the reset signal voltage Vrst will be larger than the pixel signal voltage Vsig, the sensing circuit 50 needs to modulate the resistance of one of the branches 51, 61 to maintain identical $I_R$ and $I_S$ currents. In the illustrated example, the sensing circuit 50 can increase the resistance Rx associated with the switched capacitor 68 (FIG. 2a) of the second branch 61 by occasionally skipping clocks to the gate of PMOS transistor 64. The counter 90 keeps track of the number, M, of times the resistance Rx is adjusted over a predetermined number of clock cycles N. The number of clock cycles N is typically equal to $2^n$, where n is the number of bits of resolution in the analog-to-digital converter 100. The number M of times the resistance Rx is changed, can be used by the counter 90 to generate a digital code ADC CODE corresponding to the actual light impinging on the pixel.

The operation of the sensing circuit 50 can be expressed by the following current equations:

$$(Vaa-Vsig-Vtp66)/Rx=(Vaa-Vrst-Vtp56)/Ri, \quad (1)$$

where Vtp66 is the threshold voltage of the sixth PMOS transistor 66 and Vtp56 is the threshold voltage of the third PMOS transistor 56. This equation becomes:

$$(Vaa-Vsig-Vtp66)=(Vaa-Vrst-Vtp56)\cdot Rx/Ri \quad (2)$$

It is known that the ratio of the resistance Ri to resistance Rx is inversely proportional to the number, M, of times the resistance Rx is adjusted over a predetermined number of clock cycles N. As such, equation (2) becomes:

$$Ri/Rx=M/N=(Vaa-Vrst-Vtp56)/(Vaa-Vsig-Vtp66) \quad (3)$$

Although the sigma-delta sensing circuit 50 and the sigma-delta analog-to-digital converter 100 operate effectively to produce a digital code ADC CODE representing the light impinging on a pixel, they are not without their shortcomings. For example, as shown in the above equations, the output code ADC CODE is essentially based on the ratio of the Vsig and Vrst voltages. These voltages, however, may have been adversely impacted by noise during the readout and/or sample and hold operations, which is stored in the Vrst and Vsig signals. This noise, therefore, factors into the operation of the sensing circuit 50 (and the analog-to-digital converter 100), which may cause undesirable results.

Thus, it is desirable to mitigate noise from the sigma-delta modulation sensing circuit 50 and analog-to-digital converter 100 to achieve more accurate results. It is also desirable to implement gain control within the sigma-delta modulation sensing circuit 50 and analog-to-digital converter 100.

SUMMARY

The invention provides a sigma-delta modulation sensing circuit and an analog-to-digital converter that substantially mitigate the effects of noise associated with the reset and pixel signal voltages being sensed.

The invention also provides a sigma-delta modulation sensing circuit and an analog-to-digital converter that includes gain control for an imager incorporating the sensing circuit and an analog-to-digital converter.

The above and other features and advantages are achieved in various exemplary embodiments of the invention by providing an imager with a sigma-delta modulation sensing circuit and an analog-to-digital converter that do not rely on the ratio of the reset and pixel voltage levels being sensed. The sensing circuit includes a regulation branch based on a reference voltage common across multiple columns of the imager. The regulation branch has an adjustable resistance that is modulated during the sensing operation, which creates an adjustment current that is applied during the sensing operation to a current associated with one of the reset and pixel signals. The sensing circuit and analog-to-digital converter can generate a digital code based on the difference between the reset and pixel signal voltage levels, which substantially mitigates noise associated with the pixel and reset signal voltages. The reference voltage can also be used as a gain control for the imager as well.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

Figure 3A:
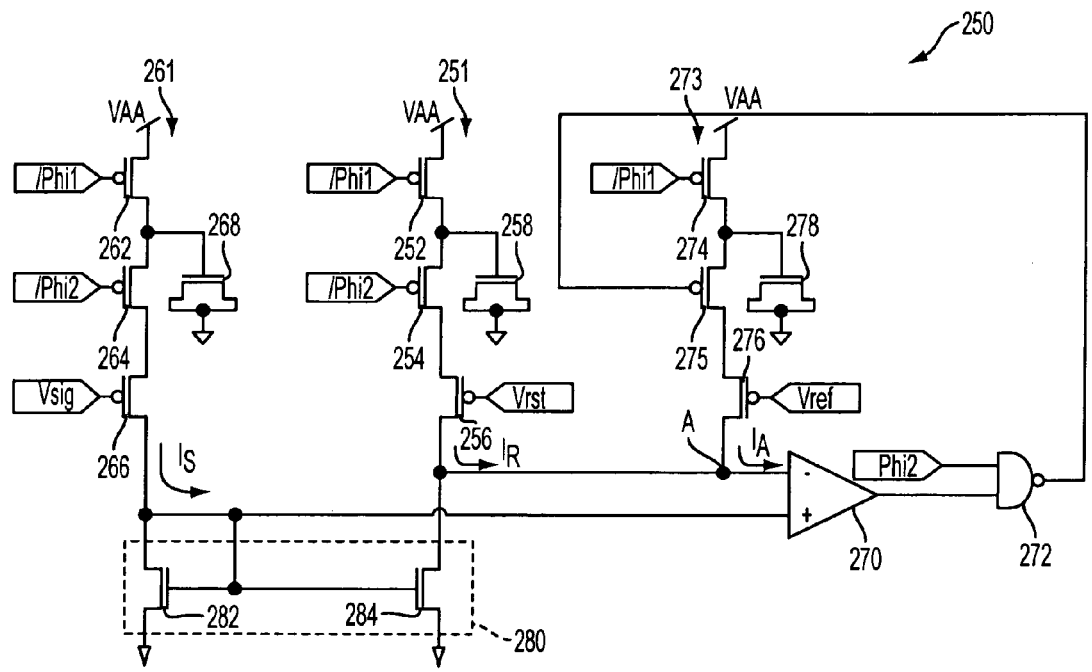
FIG. 3a illustrates a sigma-delta sensing circuit constructed in accordance with an exemplary embodiment of the invention.

FIG. 3a illustrates a sigma-delta sensing circuit 250 constructed in accordance with an exemplary embodiment of the invention.

The sensing circuit 250 comprises a first branch 251 for sensing the reset signal Vrst from a sample and hold capacitor (not shown), a second branch 261 for sensing the pixel signal Vsig from another sample and hold capacitor (not shown) and a regulation branch 273. The sensing circuit 250 also comprises a current mirror 280, a comparator 270 and a NAND gate 272. The comparator 270 is preferably a regenerative latch type comparator, where the digital output is synchronized to the phase clocks. Smoothing capacitors (not shown) are preferably added to e.g., all source follower outputs to convert the switching nature of the currents through all branches 251, 261, 273 into near-DC currents for the source follower.

The first branch 251 comprises three PMOS transistors 252, 254, 256 and a capacitor 258. The first PMOS transistor 252 is connected between a supply voltage Vaa and a source/drain terminal of the second PMOS transistor 254. The gate of the first PMOS transistor 252 is connected to a first clock signal /PHI1. The second PMOS transistor 254 has a second source/drain terminal connected to a source/drain terminal of the third PMOS transistor 256. The gate of the second PMOS transistor 254 is connected to a second clock signal /PHI2. The capacitor 258 is connected between a ground potential and the connection between the first and second PMOS transistors 252, 254.

The second source/drain terminal of the third PMOS transistor 256 is connected to a source/drain terminal of a second NMOS transistor 284 of the current mirror 280. The gate of the third PMOS transistor 256 is connected to receive the reset signal Vrst; the third PMOS transistor 256 acts as a source follower transistor for the first branch 251. The second source/drain of the third PMOS transistor 256 is also coupled to a node A, which is coupled to a first input of the comparator 270.

In operation, the first clock signal /PHI1 is applied to the gate of the first PMOS transistor 252 and the second clock signal /PHI2 is applied to the gate of the second PMOS transistor 254 in a complementary non-overlapping fashion and at a specified frequency. The designations "/PHI1" and "/PHI2" are used to mean the inverted clock signal of non-overlapping clocks PHI1 and PHI2, respectively. Thus, /PHI1 and /PHI2 cannot be low at the same time. The clock signals /PHI1, /PHI2 are typically generated by a clock generator or control circuit (e.g., control circuit 450 of FIG. 4). The two PMOS transistors 252, 254 act as switches under the control of their respective clock signals /PHI1, /PHI2. Activating the first PMOS transistor 252 (i.e., closing the switch) immediately after deactivating the second PMOS transistor 254 (i.e., opening the switch) will charge the capacitor 258. Similarly, deactivating the first PMOS transistor 252 (i.e., opening the switch) immediately before activating the second PMOS transistor 254 (i.e., closing the switch) will discharge the capacitor 258.

Figure 3B:
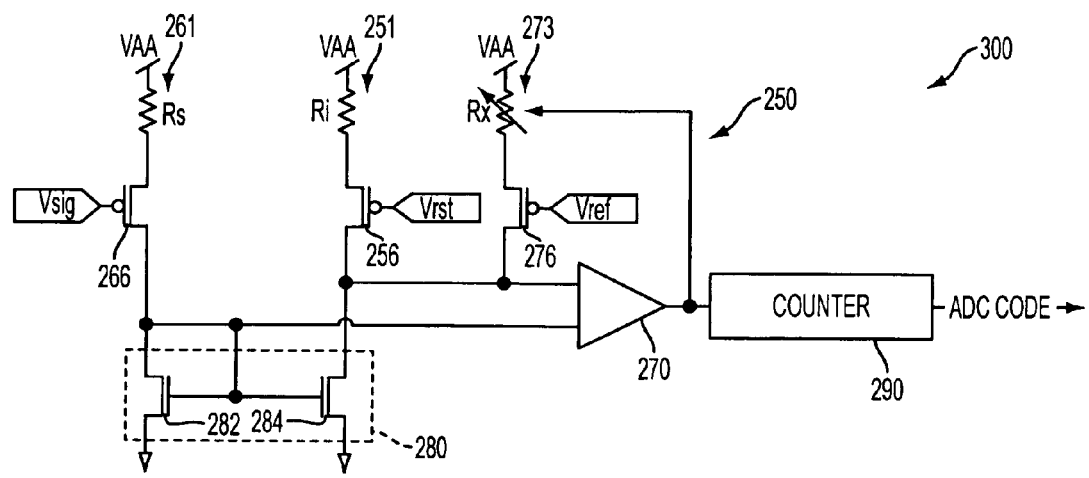
FIG. 3b illustrates a sigma-delta analog-to-digital converter circuit constructed in accordance with an exemplary embodiment of the invention.

Using the non-overlapping complementary clock signals /PHI1, /PHI2 to open and close the "switches" (i.e., transistors 252, 254) causes the capacitor 258 to simulate a resistor (e.g., resistor Ri in FIG. 3b). The equivalent resistance of the resistor Ri is equal to $1/f \cdot C$, where C is the capacitance of the capacitor 258 and f is the frequency of the clock signals /PHI1, /PHI2. By varying the frequency f, the resistance may be adjusted or modulated as desired. A reset current $I_R$ based on the resistance of the first branch 251 and the Vrst voltage level flows through the first branch 251 to node A.

The second branch 261 comprises three PMOS transistors 262, 264, 266 and a capacitor 268. The fourth PMOS transistor 262 is connected between the supply voltage Vaa and a source/drain terminal of the fifth PMOS transistor 264. The gate of the fourth PMOS transistor 262 is connected to the first clock signal /PHI1. The fifth PMOS transistor 264 has a second source/drain terminal connected to a source/drain terminal of the sixth PMOS transistor 266. The gate of the fifth PMOS transistor 264 is connected the second clock signal /PHI2. The second capacitor 268 is connected between a ground potential and the connection between the fourth and fifth PMOS transistors 262, 264.

The second source/drain terminal of the sixth PMOS transistor 266 is connected to a source/drain terminal of a first NMOS transistor 282 of the current mirror 280. The gate of sixth PMOS transistor 266 is connected to receive the pixel signal Vsig, where the sixth PMOS transistor 266 acts as a source follower transistor for the second branch 261. The second source/drain of the sixth PMOS transistor 266 is also coupled to a second input of the comparator 270. The output of the comparator 270 is connected to a first input of the NAND gate 272. The second clock signal PHI2 is connected to a second input of the NAND gate 272.

In operation, the first clock signal /PHI1 is applied to the gate of the fourth PMOS transistor 262 while the second clock signal /PHI2 is applied to the gate of the fifth PMOS transistor 264. As set forth above, the clock signals /PHI1, /PHI2 are non-overlapping complementary signals. The two PMOS transistors 262, 264 act as switches, where the fourth PMOS transistor 262 is controlled by the first clock signal /PHI1 and the fifth PMOS transistor 264 is controlled by the second clock signal /PHI2. Activating the fourth PMOS transistor 262 (i.e., closing the switch) immediately after deactivating the fifth PMOS transistor 264 (i.e., opening the switch) will charge the capacitor 268. Similarly, deactivating the fourth PMOS transistor 262 (i.e., opening the switch) immediately before activating the fifth PMOS transistor 264 (i.e., closing the switch) will discharge the capacitor 268.

Using the non-overlapping complementary clock signals /PHI1, /PHI2 to open and close the "switches" (i.e., transistors 262, 264) causes the capacitor 268 to simulate a resistor (e.g., resistor Rs in FIG. 3b) with an equivalent resistance equal to $1/f \cdot C$, where C is the capacitance of the capacitor 268 and f is the frequency of the clock signals /PHI1, /PHI2. As set forth above, by varying the frequency f, the resistance may be adjusted or modulated as desired. A pixel signal current $I_S$ based on the resistance of the second branch 261 and the Vsig voltage level flows through the second branch 261 to the comparator 270.

The regulation branch 273 comprises three PMOS transistors 274, 275, 276 and a capacitor 278. The seventh PMOS transistor 274 is connected between the supply voltage Vaa and a source/drain terminal of the eighth PMOS transistor 275. The gate of the seventh PMOS transistor 274 is connected to the first clock signal /PHI1. The eighth PMOS transistor 275 has a second source/drain terminal connected to a source/drain terminal of the ninth PMOS transistor 276. The gate of the eighth PMOS transistor 275 is connected the output of the NAND gate 272. The third capacitor 278 is connected between a ground potential and the connection between the seventh and eighth PMOS transistors 274, 275.

The second source/drain terminal of the ninth PMOS transistor 276 is connected to node A and the first input of the comparator 270. The gate of ninth PMOS transistor 276 is connected to receive a reference voltage Vref. In a desired embodiment, the reference voltage Vref will be common to all columns of a pixel array of the imager. The ninth PMOS transistor 276 acts as a source follower transistor for the regulation branch 61.

In operation, the first clock signal /PHI1 is applied to the gate of the seventh PMOS transistor 274. The output of the NAND gate 272, which is either high or pulses low while PHI2 is low depending upon the output of the comparator 270, is applied to the gate of the eighth PMOS transistor 275. The two PMOS transistors 274, 275 act as switches, where the seventh PMOS transistor 274 is controlled by the first clock signal /PHI1 and the eighth PMOS transistor 275 is controlled by the output of the NAND gate 272 (as clocked by PHI2). Activating the seventh PMOS transistor 274 (i.e., closing the switch) immediately after deactivating the eighth PMOS transistor 275 (i.e., opening the switch) will charge the third capacitor 278. Similarly, deactivating the seventh PMOS transistor 274 (i.e., opening the switch) immediately before activating the eighth PMOS transistor 275 (i.e., closing the switch) will discharge the third capacitor 278. The comparator 270 triggers the output of the NAND gate 272 when the reset signal current $I_R$ is less than the pixel signal current $I_S$ (but only when the second clock signal /PHI2 has a logic state that would activate the eighth PMOS transistor 275).

Using the non-overlapping complementary clock signals /PHI1, /PHI2 (and the output of the comparator 270) to open and close the "switches" (i.e., transistors 274, 275) causes the capacitor 278 to simulate a resistor (e.g., resistor Rx in FIG. 3b) with an equivalent resistance equal to $1/f \cdot C$, where C is the capacitance of the capacitor 278 and f is the frequency of the clock signals /PHI1, /PHI2. As set forth above, by varying the frequency f, the resistance may be adjusted or modulated as desired. An adjustment current $I_A$ based on the resistance of the regulation branch 273 and the reference voltage Vref flows through the regulation branch 273 to node A where it combines with the reset current $I_R$. Thus, as will be described below in more detail, the regulation branch 273 regulates the sum of the adjustment current $I_A$ and $I_R$ to be equal to $I_S$ by adjusting $I_A$ based on the outputs of the comparator 270, NAND gate 272 and the reference voltage Vref.

The operation of the sensing circuit 250 is now explained in more detail with reference to FIG. 3b. FIG. 3b illustrates a sigma-delta analog-to-digital converter 300 using the FIG. 3a sigma-delta sensing circuit 250 constructed in accordance with an exemplary embodiment of the invention. Portions of the sensing circuit 250 illustrated in FIG. 3a have been replaced by their functional equivalents in FIG. 3b. For example, in FIG. 3b, a first resistor Ri replaces the first switched capacitor 258 and the first and second PMOS transistors 252, 254 shown in FIG. 3a. Likewise, in FIG. 3b, a second resistor Rs replaces the second switched capacitor 268 and the fourth and fifth PMOS transistors 262, 264 shown in FIG. 3a. Moreover, in FIG. 3b, a third resistor Rx, shown as an adjustable resistor, replaces the third switched capacitor 278 and the seventh and eighth PMOS transistors 274, 275 shown in FIG. 3a. The NAND gate 272 is also not shown in FIG. 3b. The illustrated analog-to-digital converter 300 also includes a counter 290 connected to the output of the comparator 270.

The sensing circuit 250, and as such, the analog-to-digital converter 300, operates based on a sigma-delta modulation approach. In principle, the sensing circuit 250 attempts to get the reset signal current $I_R$ plus adjustment current $I_A$ to be equal to the pixel signal current $I_S$. Since typically it is most likely that the reset signal current $I_R$ will be less than the pixel signal current $I_S$, the sensing circuit 250 adds the adjustment current $I_A$ to the reset signal current $I_R$ during the sense operation.

This is achieved by modulating the resistance of the regulation branch 273 such that the branch creates a suitable adjustment current $I_A$ over the course of the sensing operation. The counter 290 keeps track of the number, M, of times the resistance Rx is adjusted over a predetermined number of clock cycles N. The number of clock cycles N is typically equal to $2^n$, where n is the number of bits of resolution in the analog-to-digital converter 300. The number M of times the resistance Rx is changed directly corresponds to the difference between the pixel signal voltage Vsig and the reset signal voltage Vrst. As such, the number M of times the resistance Rx is changed will be used by the counter 290 to generate a digital code ADC CODE corresponding to the actual light impinging on the pixel.

The operation of the sensing circuit 250 can be expressed by the following current equations:

$$(Vaa-Vsig-Vtp266)/Rs = (Vaa-Vrst-Vtp256)/Ri + (Vaa-Vref-Vtp276)/Rx, \quad (4)$$

where Vtp266 is the threshold voltage of the sixth PMOS transistor 266, Vtp256 is the threshold voltage of the third PMOS transistor 256 and Vtp276 is the threshold voltage of the ninth PMOS transistor 276. In a desired embodiment, Rs=Ri. Thus, equation (4) becomes:

$$(Vaa-Vsig-Vtp266)-(Vaa-Vrst-Vtp256) = (Vaa-Vref-Vtp276) \cdot Ri/Rx \quad (5)$$

It is known that the ratio of the resistance Ri to resistance Rx is inversely proportional to the number, M, of times the resistance Rx is adjusted over a predetermined number of clock cycles N. In addition, in a desired embodiment, Vtp266 is assumed equal to Vtp256. As such, equation (5) becomes:

$$Ri/Rx = M/N = (Vrst-Vsig)/(Vaa-Vref-Vtp276) \quad (6)$$

Figure 2A:
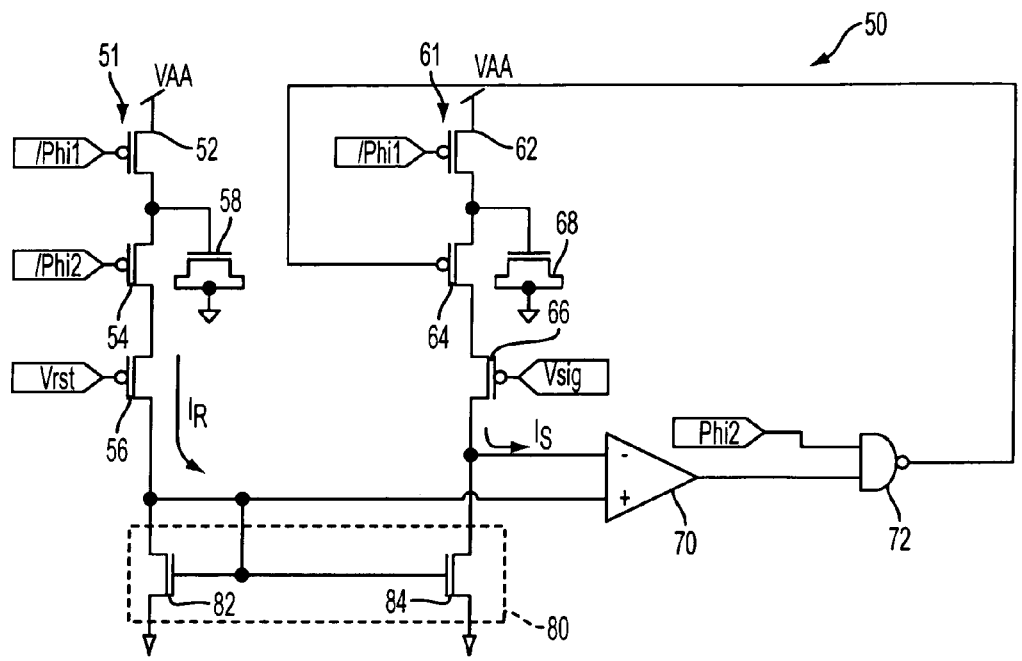
FIG. 2a illustrates a conventional sigma-delta sensing circuit.
Figure 2B:
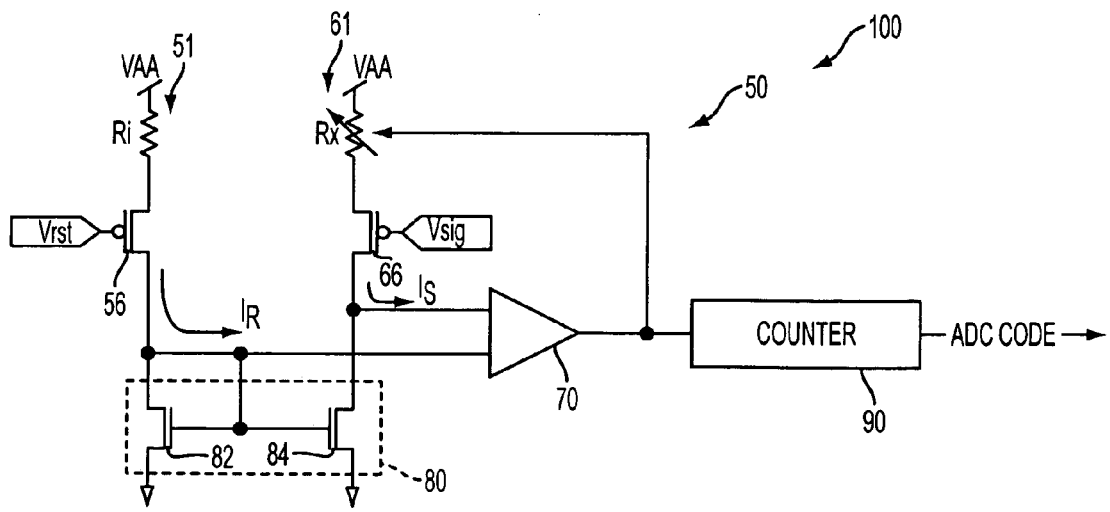
FIG. 2b illustrates a conventional sigma-delta analog-to-digital converter using the FIG. 2a sigma-delta sensing circuit.

As such, the sigma-delta modulation sensing operation of the invention is based on the difference between the reset signal voltage Vrst and the pixel signal voltage Vsig as opposed to a ratio of these two voltages. Thus, the sensing circuit 250 provides for a "true" subtraction between the reset signal voltage Vrst and the pixel signal voltage Vsig. Using the difference between the reset signal voltage Vrst and the pixel signal voltage Vsig means that noise associated with both of these signals is subtracted out and not carried into the analog-to-digital conversion process—unlike the conventional sensing circuit 50 (FIG. 2a), where the noise is not subtracted out. In addition, the denominator of equation (6) is based on the reference voltage Vref and not the reset signal voltage Vrst or the pixel signal voltage Vsig.

Figure 4:
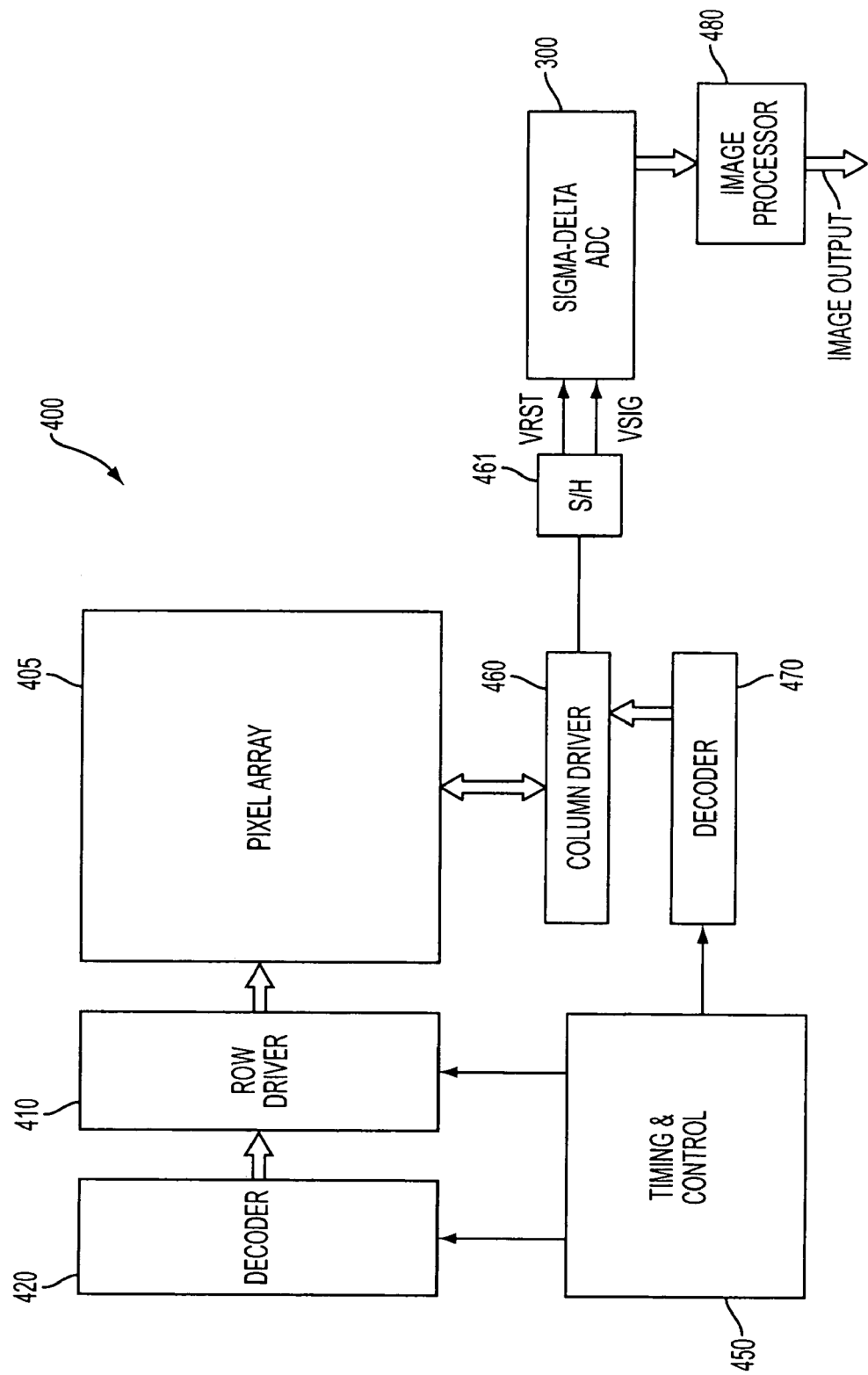
FIG. 4 shows an imager constructed in accordance with an embodiment of the invention.

It should be appreciated that process variations could cause Vtp256 to be different than Vtp266 across columns in a pixel array (e.g., array 405 of FIG. 4). Accordingly, in the desired embodiment, there will be a mechanism to counteract any variations between the threshold voltages Vtp256, Vtp266 on a column by column basis. For instance, the image processor (e.g., image processor 480 of FIG. 4) or other processing unit may retain offsets or other adjustment values to provide a digital adjustment for these variations based on calibration or other testing results.

An additional benefit of the sensing circuit 250 is that the reference voltage Vref can be used as a gain control mechanism to increase or decrease the brightness of the pixel signals throughout the imager. That is, the reference voltage Vref itself may be adjusted to adjust how much current flows through the sensing circuit 250. This in turn can be used for gain control in a very simple manner.

Figure 1:
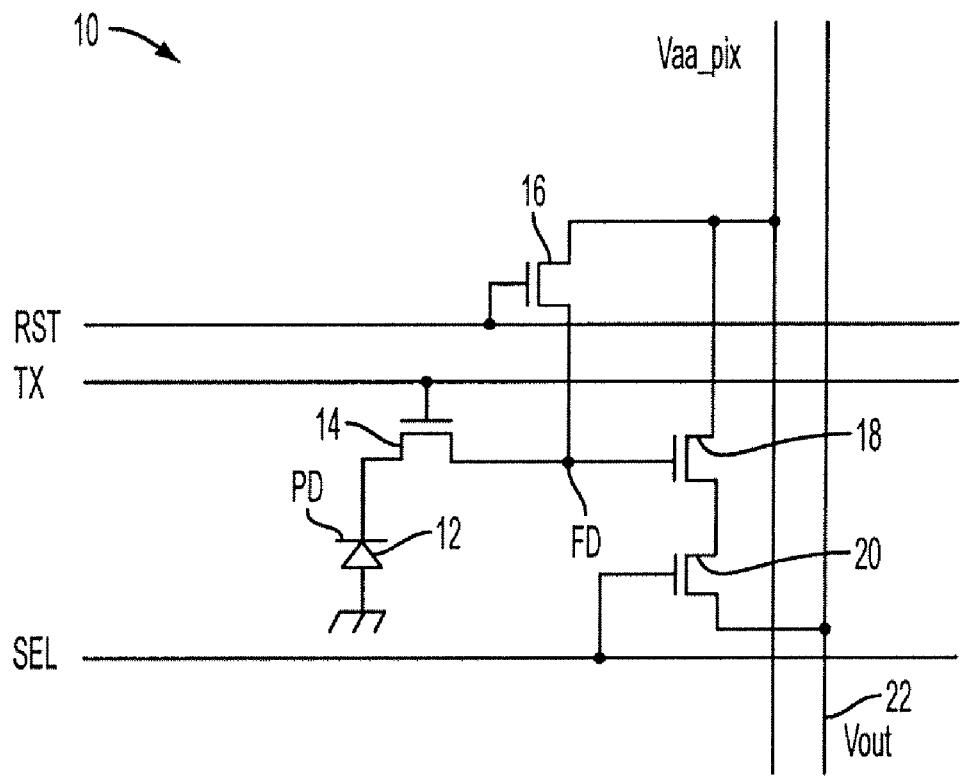
FIG. 1 illustrates a conventional imager pixel circuit.

FIG. 4 illustrates an exemplary imager 400 that may utilize a sigma-delta analog-to-digital converter 300 constructed in accordance with the invention. The Imager 400 has a pixel array 405 comprising pixels constructed as described above with respect to FIG. 1, or using other pixel architectures. Row lines are selectively activated by a row driver 410 in response to row address decoder 420. A column driver 460 and column address decoder 470 are also included in the imager 400. The imager 400 is operated by the timing and control circuit 450, which controls the address decoders 420, 470. The control circuit 450 also controls the row and column driver circuitry 410, 460.

A sample and hold circuit 461 associated with the column driver 460 reads a pixel reset signal Vrst and a pixel image signal Vsig for selected pixels. The analog-to-digital converter 300 (ADC) outputs a digital code corresponding to the difference between the Vrst and Vsig signals as discussed above with respect to FIGS. 3a-3b. The analog-to-digital converter 300 supplies the digitized pixel signals to an image processor 480 which forms a digital image.

Figure 5:
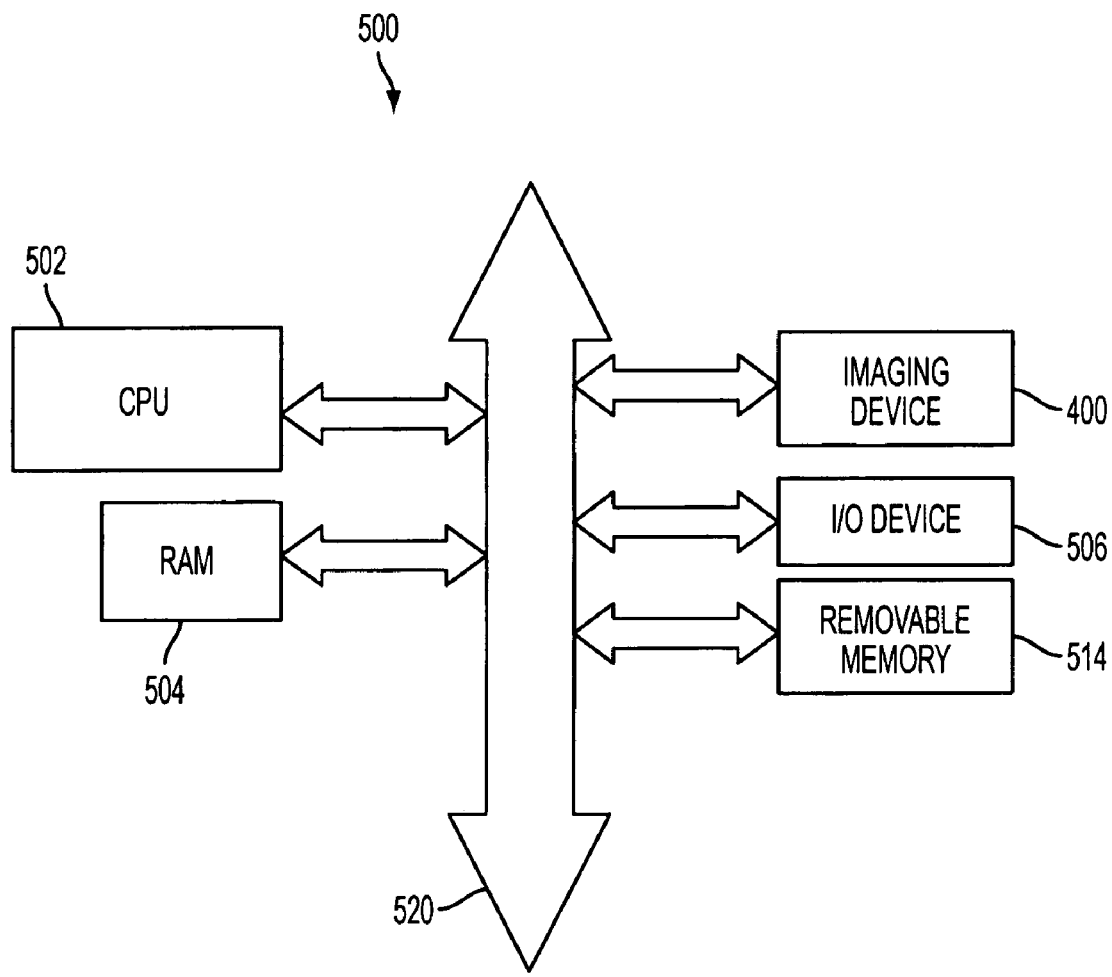
FIG. 5 shows a processor system incorporating at least one imager constructed in accordance with an embodiment of the invention.

FIG. 5 shows a system 500, a typical processor system modified to include an imaging device 400 (FIG. 4) of the invention. The processor system 500 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 500, for example a camera system, generally comprises a central processing unit (CPU) 502, such as a microprocessor, that communicates with an input/output (I/O) device 506 over a bus 520. Imaging device 400 also communicates with the CPU 502 over the bus 520. The processor-based system 500 also includes random access memory (RAM) 504, and can include removable memory 514, such as flash memory, which also communicate with the CPU 502 over the bus 520. The imaging device 400 may be combined with a processor, such as a CPU, digital signal processor, or microprocessor, with or without memory storage on a single integrated circuit or on a different chip than the processor.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A sensing circuit for an imager, said sensing circuit comprising:
    a first circuit branch for inputting a reset signal voltage and creating a reset current;
    a second circuit branch for inputting a pixel signal voltage and creating a pixel current; and
    an adjustment branch for creating an adjustment current from a reference voltage using sigma-delta modulation of a resistance in said adjustment branch, said adjustment current being combined with the reset current when the reset current does not equal the pixel current, said adjustment branch resistance comprising a switched capacitor circuit, said switched capacitor circuit comprising:
        a capacitor coupled between a node and a first voltage,
        a first switch coupled between a second voltage source and the node, and
        a second switch coupled between the node and a third voltage;
        wherein the first switch is controlled by a first clock signal and the second switch is controlled by an output of a comparison circuit.

2. The sensing circuit of claim 1, wherein a number of times the resistance is modulated corresponds to a difference between the pixel signal voltage and the reset signal voltage.

3. The sensing circuit of claim 1, wherein said adjustment branch is connected to a comparator for comparing the combined current to the pixel current.

4. The sensing circuit of claim 1, wherein the first switch is controlled by a first clock signal and the second switch is controlled by a second clock signal.

5. The sensing circuit of claim 1, wherein said first circuit branch creates the reset current by applying the reset signal voltage to a switched capacitor resistance.

6. The sensing circuit of claim 1, wherein said second circuit branch creates the pixel current by applying the pixel signal voltage to a switched capacitor resistance.

7. The sensing circuit of claim 1, wherein said reference voltage controls a signal gain of the imager.

8. An analog-to-digital converter for an imager, said analog-to-digital converter comprising:
a sensing circuit comprising:
a first circuit for inputting a reset signal voltage and creating a reset current,
a second circuit for inputting a pixel signal voltage and creating a pixel current, and
an adjustment circuit for creating an adjustment current from a reference voltage by modulating a resistance in said adjustment circuit, said adjustment current being combined with the reset current when the reset current does not equal the pixel current, said adjustment branch resistance comprising a switched capacitor circuit; and
a counter for counting a number of times the resistance is modulated and outputting a digital code corresponding to a difference between the pixel signal voltage and the reset signal voltage, wherein said switched capacitor circuit comprises:
a capacitor coupled between a node and a first voltage,
a first switch coupled between a second voltage source and the node, and
a second switch coupled between the node and a third voltage;
wherein the first switch is controlled by a first clock signal and the second switch is controlled by an output of a comparison circuit.

9. The analog-to-digital converter of claim 8, wherein said adjustment circuit is connected to a comparator for comparing the combined current to the pixel current.

10. The analog-to-digital converter of claim 8, wherein the first switch is controlled by a first clock signal and the second switch is controlled by a second clock signal.

11. The analog-to-digital converter of claim 8, wherein said first circuit creates the reset current by applying the reset signal voltage to a switched capacitor resistance.

12. The analog-to-digital converter of claim 8, wherein said second circuit creates the pixel current by applying the pixel signal voltage to a switched capacitor resistance.

13. The analog-to-digital converter of claim 8, wherein said reference voltage controls a signal gain of the imager.

14. An imager comprising:
a pixel array, said pixel array comprising a plurality of columns of pixels;
a sample and hold circuit coupled to at least one column of said array; and
an analog-to-digital converter coupled to input reset and pixel signal voltages from said sample and hold circuit, said analog to digital-converter comprising:
a first circuit for inputting the reset voltage and creating a reset current,
a second circuit for inputting the pixel signal voltage and creating a pixel current, and
an adjustment circuit for creating an adjustment current from a reference voltage by modulating a resistance in said adjustment circuit, said adjustment current being combined with the reset current when the reset current does not equal the pixel current, said adjustment branch resistance comprising a switched capacitor circuit, said switched capacitor circuit comprising:
a capacitor coupled between a node and a first voltage,
a first switch coupled between a second voltage source and the node, and
a second switch coupled between the node and a third voltage;
wherein the first switch is controlled by a first clock signal and the second switch is controlled by an output of a comparison circuit; and
a counter for counting a number of times the resistance is modulated and outputting a digital code corresponding to a difference between the pixel signal voltage and the reset signal voltage.

15. The imager of claim 14, wherein said adjustment circuit is connected to a comparator for comparing the combined current to the pixel current.

16. The imager of claim 14, wherein the first switch is controlled by a first clock signal and the second switch is controlled by a second clock signal.

17. The imager of claim 14, wherein said first circuit creates the reset current by applying the reset signal voltage to a switched capacitor resistance.

18. The imager of claim 14, wherein said second circuit creates the pixel current by applying the pixel signal voltage to a switched capacitor resistance.

19. The imager of claim 14, wherein said reference voltage controls a signal gain of the imager.

20. A processor system comprising:
a processor; and
an imager coupled to said processor, said imager comprising a pixel array, said pixel array comprising a plurality of columns of pixels, a sample and hold circuit coupled to at least one column of said array, and an analog-to-digital converter coupled to input reset and pixel signal voltages from said sample and hold circuit, said analog to digital-converter comprising;
a first circuit branch for inputting the reset voltage and creating a reset current,
a second circuit branch for inputting the pixel signal voltage and creating a pixel current, and
an adjustment branch for creating an adjustment current from a reference voltage by modulating a resistance in said adjustment branch, said adjustment current being combined with the reset current when the reset current is less than the pixel current, said adjustment branch resistance comprising a switched capacitor circuit, said switched capacitor circuit comprising:
a capacitor coupled between a node and a first voltage,
a first switch coupled between a second voltage source and the node, and
a second switch coupled between the node and a third voltage;
wherein the first switch is controlled by a first clock signal and the second switch is controlled by an output of a comparison circuit; and
a counter for counting a number of times the resistance is modulated.

21. The system of claim 20, wherein said counter generates a digital code corresponding to a difference between the pixel signal voltage and the reset signal voltage.

22. The system of claim 20, wherein said adjustment branch is connected to a comparator for comparing the combined current to the pixel current.

23. The system of claim 20, wherein the first switch is controlled by a first clock signal and the second switch is controlled by a second clock signal.

24. The system of claim 20, wherein said first circuit branch creates the reset current by applying the reset signal voltage to a switched capacitor resistance.

25. The system of claim 20, wherein said second circuit branch creates the pixel current by applying the pixel signal voltage to a switched capacitor resistance.

26. The system of claim 20, wherein said reference voltage controls a signal gain of the imager.

27. A method of operating an imager, said method comprising the steps of:
   inputting a reset signal voltage and creating a reset current based on a first resistance;
   inputting a pixel signal voltage and creating a pixel current based on a second resistance; and
   creating an adjustment current by modulating a resistance and applying a reference voltage to the modulated resistance;
   combining the adjustment current with the reset current; and
   counting a number of times the resistance is modulated,
   wherein the act of modulating the resistance comprises charging and discharging a capacitor, and wherein the act of charging and discharging a capacitor comprises:
      connecting the capacitor to a first voltage based on a first clock signal, and
      connecting the capacitor to a second voltage based on a result of a comparison between the combined current and the pixel current.

28. The method of claim 27 further comprising the act of outputting a digital code equal to the number of times the resistance was modulated.

29. The method of claim 28, wherein said digital code corresponds to a difference between the pixel signal voltage and the reset signal voltage.

30. The method of claim 27, further comprising the acts of:
   comparing the combined current to the pixel current; and
   modulating the resistance to create a new adjustment current when the combined current does not equal the pixel current.

31. The method of claim 27, wherein the act of charging and discharging a capacitor comprises:
   connecting the capacitor to a first voltage based on a first clock signal; and
   connecting the capacitor to a second voltage based on a second clock signal.

32. The method of claim 27, further comprising the act of adjusting a signal gain of the imager by adjusting the reference voltage.

33. The method of claim 27, wherein the combining act is performed when the reset current is less than the pixel current.

* * * * *